US006653879B2

(12) United States Patent
Cyrusian et al.

(10) Patent No.: US 6,653,879 B2
(45) Date of Patent: Nov. 25, 2003

(54) METHOD AND SYSTEM FOR MANAGING A PULSE WIDTH OF A SIGNAL PULSE

(75) Inventors: Sasan Cyrusian, Scotts Valley, CA (US); Michael A. Ruegg, Santa Cruz, CA (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/865,786

(22) Filed: May 25, 2001

(65) Prior Publication Data

US 2002/0175724 A1 Nov. 28, 2002

(51) Int. Cl.[7] .............................. H03K 5/04
(52) U.S. Cl. .................... 327/172; 327/173; 327/174
(58) Field of Search .............................. 327/172, 173, 327/174, 175

(56) References Cited

U.S. PATENT DOCUMENTS

| | | | | |
|---|---|---|---|---|
| 5,604,751 A | * | 2/1997 | Panis | 714/724 |
| 6,114,914 A | * | 9/2000 | Mar | 327/115 |
| 6,127,858 A | * | 10/2000 | Stinson et al. | 327/276 |
| 6,285,726 B1 | * | 9/2001 | Gaudet | 327/156 |
| 6,380,774 B2 | * | 4/2002 | Saeki | 327/116 |

OTHER PUBLICATIONS

"Synchronous Recording Channels—PRML & Beyond", rev. 5.61 14.E.18, 1999, published by Knowledge Tek, Inc., Broomfield, Colorado.
"PRML: Seagate Uses Space Age Technology" available on the Internet at http://www.seagate.com/support/kb/disc/prml.html, 2 pages, last accessed Apr. 9, 2001.
"Technologies—PRML" available on the Internet at http://www.idema.org/about/industry/ind_tech_prml.html, 1 page last accessed Apr. 9, 2001.
"Reference Guide—Hard Disk Drives" available on the Internet at http://www.storagereview.com/guide2000/ref/hdd, 13 pages, last accessed Apr. 9, 2001.
"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.
"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—Timothy P. Callahan
Assistant Examiner—Cassandra Cox
(74) Attorney, Agent, or Firm—Brinks Hofer Gilson & Lione

(57) ABSTRACT

An input signal is received having a period and an input pulse width. The input pulse width of an input signal is adjusted to an output pulse width of an output signal based upon a recording control signal for control of recording on a storage medium. The output signal and the output pulse width is derived from a triggering edge of a first selected signal of a first selected phase and a triggering edge of a second selected signal of a second selected phase in succession. The first selected signal and the second selected signal are selected from an assortment of reference signals that have distinct relative phases to provide the output pulse width of a desired duration. The number of distinct relative phases available for formation of the output pulse width is increased by one or more of the following: delaying, dividing, inverting, and interpolating one or more reference signals.

23 Claims, 8 Drawing Sheets

METHOD AND SYSTEM FOR MANAGING A PULSE WIDTH OF A SIGNAL PULSE

FIELD OF INVENTION

The invention relates to a method and system for managing a pulse width of a signal pulse representative of data to be recorded on a storage medium.

BACKGROUND OF THE INVENTION

In the prior art, multiple delay stages may be used to adjust the pulse width of a signal pulse to provide a desired pulse width for recording on a storage medium (e.g., a magnetic disk). However, the delay stages may not provide uniform delays between neighboring phase intervals, which may result in inaccurate formation of an adjusted pulse width. In one example, a first stage may provide a different resultant delay than a second stage because of differential thermal performance of one or more semiconductors in the respective stages. In another example, the first stage and second stage provide disparate or non-uniform delays between neighboring phases because of manufacturing process variations in fabrication of the first stage versus the second stage. The actual desired pulse width of a digital signal pulse may vary with ambient temperature fluctuations and manufacturing-process variations such that the recording on the storage medium deviates from a desired adjusted pulse width. Accordingly, for reliable recording of data, reading of data, or both, a need exists for accurately determining an adjusted pulse width in a precise manner that minimizes the impact of disparities between delay stages or the number of requisite delay stages.

BRIEF SUMMARY OF THE INVENTION

In accordance with one aspect of the invention, an input signal is received having a period and an input pulse width. The input pulse width of an input signal is adjusted to an output pulse width of an output signal based upon a recording control signal for control of recording on a storage medium. The output signal and the output pulse width is derived from a triggering edge of a first selected signal of a first selected phase and a triggering edge of a second selected signal of a second selected phase in succession. The first selected signal and the second selected signal are selected from an assortment of reference signals that have distinct relative phases to provide the output pulse width of a desired duration. The number of distinct relative phases available for formation of the output pulse width is increased by one or more of the following: delaying, dividing, inverting, and interpolating one or more reference signals.

DETAILED DESCRIPTION OF THE INVENTION

Figure 1:
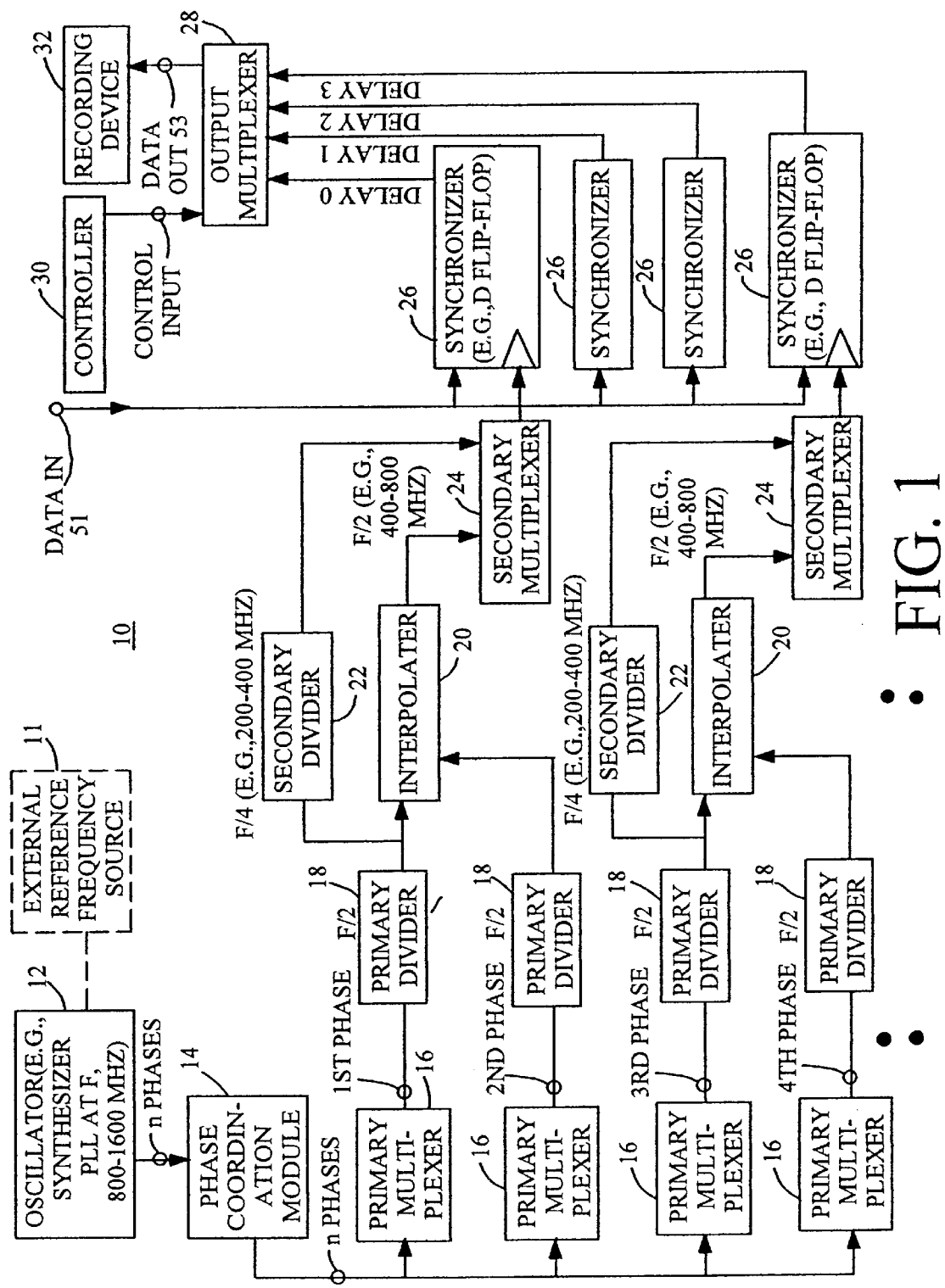
FIG. 1 is a block diagram of a system for managing a pulse width of a signal pulse in accordance with the invention.

In accordance with the invention, FIG. 1 illustrates a management system 10 for managing a pulse width of a signal pulse of a signal. The management system 10 comprises an oscillator 12 (e.g., a phase-locked loop synthesizer (PLL) or voltage controlled oscillator (VCO)). The oscillator 12 is coupled to a phase coordination module 14 (e.g., a phase zero restart module). In turn, the phase coordination module 14 is coupled to primary multiplexers 16. The primary multiplexers 16 feed corresponding primary dividers 18. Each pair of the primary dividers 18 are associated with a corresponding interpolator 20. The output of one of each pair of the primary dividers 18 is coupled to a secondary divider 22. The secondary divider 22 and the output of the interpolator 20 feed a respective secondary multiplexer 24. The secondary multiplexer 24 and an input signal terminal represent inputs to a corresponding synchronizer 26 (e.g., a flip-flop or an edge-triggered D flip-flop). A group of synchronizers 26 are connected to an output multiplexer 28. The output multiplexer 28 communicates with a recording device 32 (e.g., a hard disk drive) for recording on a storage medium (e.g., a magnetic disk). A controller 30 provides recording control data to the output multiplexer 28.

An input signal is inputted at the input signal terminal 51. The input signal may comprise a generally square wave, a generally sinusoidal wave, a generally triangular wave, or some other waveform. The input signal has a period and an input pulse width of a pulse. The input pulse width of an input signal is adjusted to an output pulse width of an output signal at an output terminal 53 based upon the controller's provision of a recording control data for control of recording on a storage medium. A first selected signal and a second selected signal are selected from an assortment of reference signals (e.g., reference clock signals) that have distinct relative phases to provide the output pulse width of a desired duration. The output signal and the output pulse width is derived from a triggering edge (e.g., a rising edge) of the first selected signal of the first selected phase and a triggering edge (e.g., a rising edge) of a second selected signal of second selected phase in succession. The number distinct relative phases available for formation of the output pulse width are increased by one or more of the following procedures: delaying one or more reference signals, division of a reference signal, interpolation of two reference signals, and inversion of a reference signal. The output pulse width may be defined by a base period of the input pulse width plus an adjustment interval. The adjustment interval may have an incremental value or a discrete value that is proportional to or a fraction of the duration of the period of the input pulse width. The output multiplexer 28 accepts a control signal as input from a controller 30 and outputs an output signal to a recording device 32, consistent with the control data.

The oscillator 12 generates reference signals that have corresponding distinct phases or delay intervals. For example, the oscillator 12 may output N (e.g., 16) reference signals with different reference phase offsets with respect to one another. The step size or incremental value of the offsets between adjacent phases is generally uniform. The distinct phases outputted by the oscillator 12 may be referred to a first set of phases. The oscillator 12 may comprise a phased-locked loop synthesizer that uses multiple delay stages to provide the first set of phases.

In one embodiment, the oscillator 12 may be referenced to a crystal reference, an external oscillator, or another external reference frequency source 11 to provide a stabile phase over time, where the delay between the two neighboring oscillator phases are generally constant or locked in phase. The external reference frequency source 11 is optional and indicated by dashed lines in FIG. 1. "Locked in phase" means that the edges (e.g., rising edges) of pulses of different reference signals (e.g., reference clock signals) of different reference phases are synchronously coordinated with respect to one another. If the external reference frequency source 11 were to drift, all of the reference phases that are locked to the external reference frequency source 11 would drift equally. Therefore, the relative phases of different reference signals are kept uniform regardless of phase and/or frequency drift of the external frequency source 11. By maintaining the uniform nature of the phase relationships between different reference phases, the system for managing a pulse width of the invention is well suited for precise adjustments from an input pulse width to an output pulse width.

For example, an external reference frequency source 11 feeds the oscillator 12 to provide a stabile and accurate reference frequency signal. The reference signals and divided signals, derived from the reference signals, are locked in phase with respect to the external reference frequency source 11. However, the interpolated reference phases, outputted by the interpolator 20, are not locked in phase with respect to the external reference frequency source 11. The oscillator 12 outputs a first phase through an Nth phase in a known sequence to the phase coordination module 14.

The phase coordination module 14 identifies a starting phase of the first set of phases. The starting phase represents a frame of reference for application of the reference signals underlying the first set of phases to the primary multiplexers 16. Once the starting phase is identified, the known sequence of the remaining distinct phases may be used to identify them. In one embodiment, reference signals are applied to N primary multiplexers 16 in sequential order beginning with the starting phase and ending with the Nth phase, where N is any positive integer ranging from 1 to N.

Each primary multiplexer 16 selects a selected reference signal having a corresponding selected phase of the first set of phases. The selected reference signal is selected from among the N reference signals outputted by the oscillator 12. The selected reference signal of an initial period is applied to a corresponding primary divider 18.

The primary divider 18 increases the initial period of the selected reference signal to a revised period. For example, the primary divider 18 may double the initial period by dividing the frequency of a reference signal by two. A pair of primary dividers 18 outputs neighboring reference signals having corresponding neighboring phases to an interpolator 20. Neighboring phases include the one or more reference phases that are closest to one another in temporal proximity. If N reference signals with N phases are inputted into the primary dividers 18, the primary dividers 18 collectively output at least 2N reference phases for the respective divided reference signals. The primary divider 18 may output in-phase (divided) reference phases and inverted (divided) reference phases that are approximately one-hundred and eighty degrees out of phase with the in-phase (divided) reference phases. In one embodiment, the output of the primary divider 18 is sent to both the secondary divider 22 and an interpolator 20.

The interpolator 20 interpolates between the neighboring reference signals to form an interpolated reference signal. The interpolated reference signal generally has an intermediate phase intermediate in value between the inputted neighboring phases. If 2N reference signals with 2N phases are inputted into the interpolators 20, the interpolators 20 collectively output 4N interpolated reference signals with 4N interpolated reference phases. The interpolator 20 accepts two neighboring reference signals having neighboring reference phases as inputs from two respective primary dividers 18. The interpolator 20 interpolates inputted, neighboring reference signals to derive a resultant interpolated signal with an interpolated phase between the input phases of the neighboring reference signals. The interpolated phase is associated with a signal a higher frequency range (e.g., 400 MHz to 800 MHz) than a lower frequency range of the secondary divider 27. The interpolator 20 may be used to double the amount of reference phases available for a management system 10 (e.g., a write pre-compensation module). Advantageously, the interpolator 20 can double the amount of reference phases available for adjustment of an input pulse width to an output pulse width without increasing the frequency of an oscillator 12.

A secondary divider 22 stage is coupled to the primary divider 18. The secondary divider 22 stage increases the previously increased period of at least one of the in-phase (divided) reference phase and the inverted (divided) reference phase outputted by the primary divider 18. The in-phase (divided) reference phase is approximately one-hundred and eighty degrees out of phase with respect to the inverted (divided) reference phase. If the input from the primary divider 18 is 2N phases, the output from the secondary divider 22 is at least 4N phases. The secondary divider 22 stage increases the number of reference phases available for selection by supporting the output of an in-phase version and an inverted version of the secondary reference phase as distinct phases. The secondary divider 22 operates in the same manner as the primary divider 18 and makes at least 4N phases available at output of the second divider output over a first lower frequency range (e.g., 200–400 MHz) proportional to the period.

A secondary multiplexer 24 is coupled to the interpolator 20 and the secondary divider 22 for selection of an interpolated reference signal having the corresponding interpolated phase or a twice divided reference signal having a divided reference phase. As shown, the interpolated reference signal has a higher frequency range of approximately half of the oscillator frequency of the oscillator 12, whereas the twice divided reference signal has a lower frequency range of approximately one-quarter the oscillator frequency of the oscillator 12. The secondary multiplexer 24 selects one of 4N different reference phases for a selected frequency range (or a duration of a period).

The secondary multiplexers 24 are coupled to corresponding synchronizers 26 (e.g., edge-triggered D flip-flops or latches). A synchronizer 26 has a clock input and a data input. The clock input may represent an edge-triggered input terminal for receiving a selected reference output signal of a selected reference phase. The data input may be coupled to the data input terminal 51 to receive an input signal having an input signal pulse width. The clock input accepts a reference output signal selected by a respective secondary multiplexer 24. The synchronizer 26 synchronizes an edge of the input pulse to a clock edge of the reference output signal from at least one of the secondary multiplexers 24.

In one configuration, the data input present at the data input prior to a clock transition at the triggering input may determine the output state of the synchronizer 26 after the clock transition. The synchronizers 26 output derivative signal components to the output multiplexer 28. The derivative signal components are derived from the input signal inputted at input terminal 51 and the reference signals, associated with corresponding reference phases. The output multiplexer 28 selects two reference signals or derivative signal components associated with the input pulse width of the input signal. The selection of output phases comprises the selection of at least a starting phase that coincides with a rising edge of a digital pulse of the input pulse width for formation of the output pulse width. Further, the selection of held output phases comprises at least an ending phase that is referenced to a falling edge of a digital pulse of input pulse width to form the output pulse width.

The output pulse width or another pulse width of the digital signal is defined by the duration between the rising edge and the falling edge. In one embodiment, the duration is permitted to range between one period and two periods of the reference signal with 4N possible reference phases. Where the oscillator 12 outputs N reference phases, an output pulse width of a digital signal at the output terminals 53 is defined by selecting one of 4N reference phases corresponding to a leading edge and one of 4N reference phases corresponding to a trailing edge of the output pulse width of the digital signal.

The output multiplexer 28 selects a phase zero at the start of a rising edge of the output pulse width. The output multiplexer 28 waits one period and selects another reference phase output at a trailing edge such that the pulse width is varied from a minimum of one period to a maximum of two periods, with 4N intervals in between the first period and the second period. For example, if the oscillator 12 provides sixteen discrete reference phases where N equals sixteen, the output multiplexer 28 could output one of the sixty-four discrete adjustment intervals.

The pulse-width adjustment, from the input pulse width of the input signal to the output pulse width of the output signal, may be carried out pursuant to a write pre-compensation procedure. Changing the pulse width may enhance recording (e.g., reading and writing performance) of a hard-disk, for example, by consideration of the characteristics of the recording medium, recording components, and reading components. The pulse width may be adjusted based on the contents of the input data (e.g., a history of one or more transitions in an input pulse train) and the magnetic storage characteristics of the disk.

A digital signal pulse of the output pulse width has a rising edge and a falling edge. The duration between the rising edge and the falling edge defines the output pulse width of the digital signal pulse. A system 10 for managing a data pulse width may comprise a write pre-compensation module that is configured to change the width of the pulse in incremental and substantially uniform steps.

The rising edge of a digital pulse outputted to the output multiplexer 28 may represent an oscillator phase. The falling edge may be the same oscillator phase as the rising edge or a different oscillator phase. If the phase is a different oscillator phase the different oscillator phase represents a lag or delay with respect to one period of the signal to change the pulse width to a desired pulse width. The pulse width is determined with reference to two oscillator phases a first oscillator phase and a second oscillator phase. The first oscillator phase represents a beginning oscillator phase that is associated with a leading edge of an output pulse width of a signal. The second oscillator phase represents an ending oscillator phase that is associated with a trailing edge of a pulse width of the signal. A wide assortment of reference phases are selected for output by the pulse-width manager 10 (e.g., write pre-compensation module).

Figure 2:
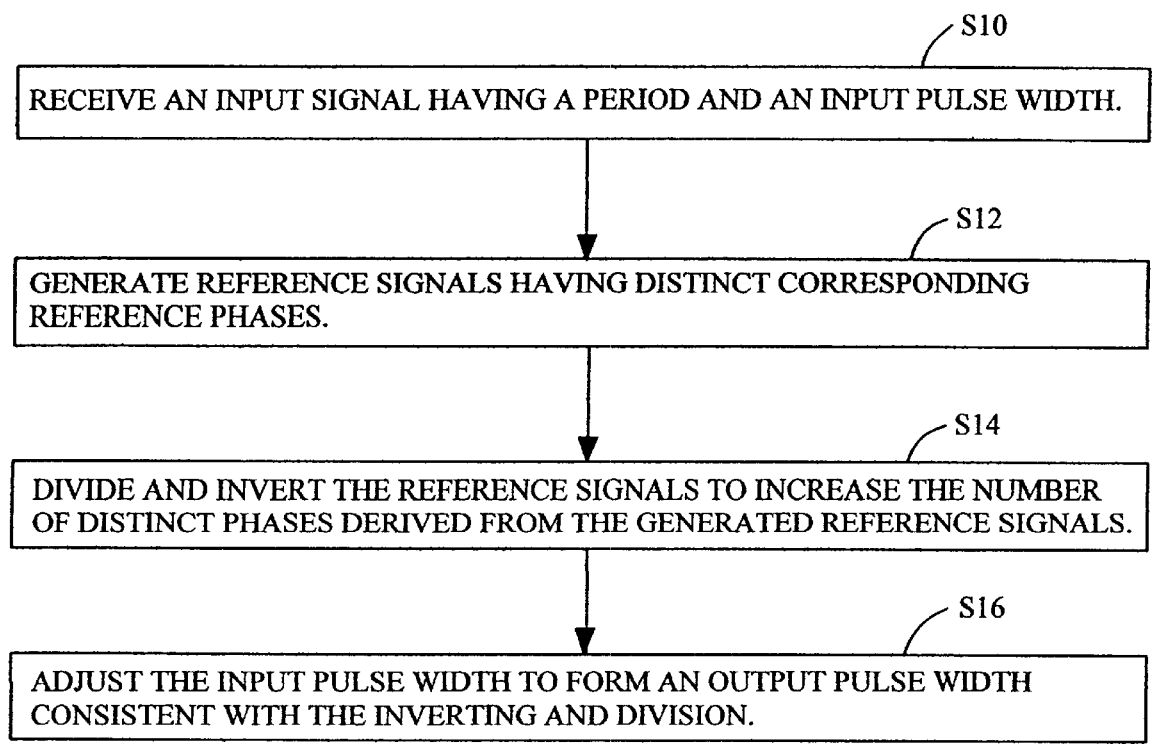
FIG. 2 is a flow chart of one method for managing a pulse width of a signal pulse in accordance with the invention.

In accordance with the invention, FIG. 2 shows a method for managing a pulse width of a signal pulse that supports fine and accurate adjustments of pulse width to promote enhanced writing and reading capabilities of a magnetic storage medium (e.g., a hard disk drive). The method of FIG. 2 starts in step S10.

In step S10, an input signal is received having an original period and input pulse width. For example, an input signal may be inputted into one or more synchronizers 26 to facilitate synchronization of the timing of the input signal to a reference signal.

In step S12, an oscillator 12 generates reference signals (e.g., reference clock signals) associated with corresponding distinct phases. For example, the oscillator 12 may comprise a group of delay stages for generating reference signals that are offset in phase with respect to one another by a defined interval. In one configuration, the generating of the reference signals in step S12 comprises feeding the oscillator 12 with an external reference frequency source 11, where the reference signals are locked in phase with respect to the external reference frequency source 11.

In step S14, a management system 10 first divides the reference signal. After the division, the management system 10 may invert the divided reference signal, pass the divided reference signal without inversion, or provide outputs of an inverted divided reference signal and a non-inverted divided reference signal. Accordingly, the division and inversion of the reference signals increase the number of distinct phases derived from the generated reference signals. For example, a primary divider 18, a secondary divider 22, or both may provide a divided in-phase output signal or a divided out-of-phase output signal by the incorporation of an inverter in at least one of the dividers. The divider may determine both an in-phase signal and an inverted phase signal for a divided signal that has twice the period duration as the original period of the signal. The in-phase signal is approximately one-hundred and eighty degrees out of phase with respect to the inverted signal.

In step S16, the management system 10 adjusts the input pulse width to form an output pulse width consistent with the availability of the inverted divided reference signal as one possible reference phase. The output pulse width may be formed with reference to a reference signal with a corresponding reference phase derived from the inversion of step S14 or a non-inverted divided reference signal. The inversion of the reference signal provides a greater selection of reference phases than might otherwise be available for adjustment of the input pulse width to the output pulse width. However, the actual selection of the reference phases in not necessarily limited to the extra reference phases provided by the phase inverting.

The output pulse width may be defined by a first signal having a first reference phase for a leading edge of the pulse and a second signal having a second reference phase a for a trailing edge of the pulse. The duration between the leading edge and the trailing edge defines the output pulse width. In one configuration, the output pulse width may have a duration, coincident with an incremental step, between the original period and twice the original period. In one example, the input pulse width is adjusted to the output pulse width based upon a recording control signal for controlling recording of a recorder. The recorder may comprise a recording device 32 that writes data, reads data, or both writes data and reads data to a magnetic storage medium, such as a hard-disk drive or a magnetic storage medium. The input pulse width may be equal to the output pulse width, or the output pulse width may exceed the input pulse width by up to one period, for instance. The output multiplexer 28 selects or the management system selects a reference signal with an appropriate reference phase for formation of the output pulse width consistent with the determined adjustment of step S16.

Figure 3:
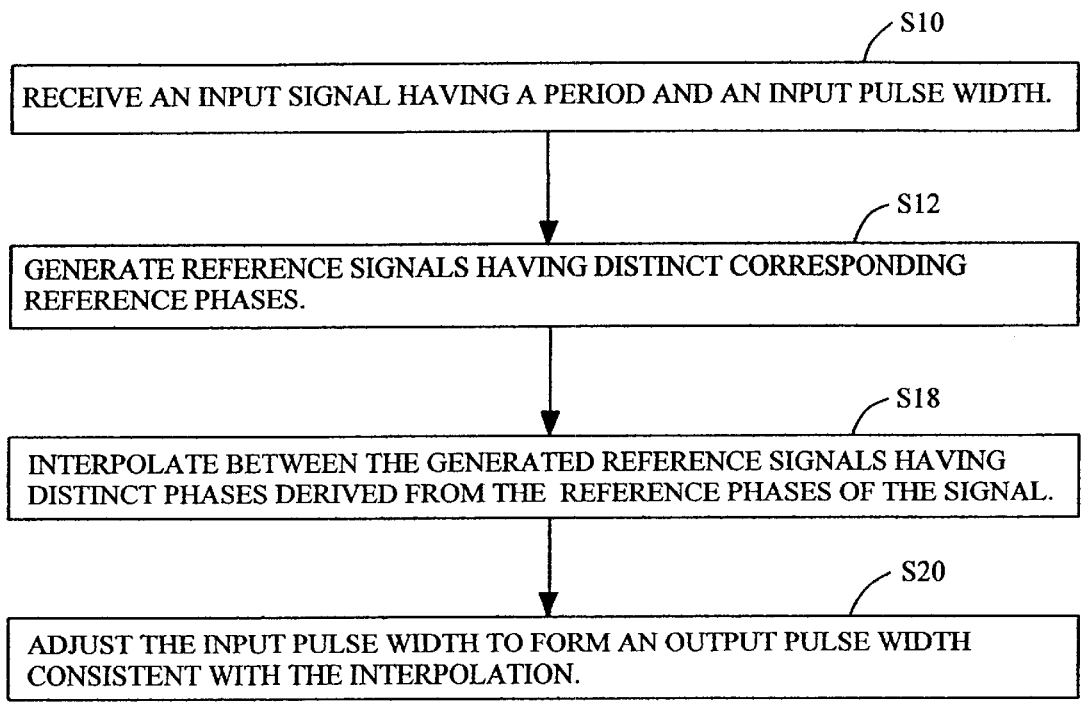
FIG. 3 is a flow chart of another method for managing a pulse width of a signal pulse in accordance with the invention.

In accordance with another embodiment of the invention, FIG. 3 shows a method for managing a pulse width of a signal supports fine and accurate adjustments of pulse width to promote enhanced writing and reading capabilities of a magnetic storage medium (e.g., a hard disk drive). Like steps in the method of FIG. 2 and the method of FIG. 3 are indicated by like reference numbers.

In step S18 after step S12, the interpolator 20 interpolates between the generated reference signals having distinct phases derived from reference phases of the signal. For example, the interpolator 20 may interpolate a resultant interpolated phase based on associated neighboring reference phases. The interpolated phase represents an intermediate phase with respect to the neighboring reference phases. The neighboring reference phases may refer to any pair of reference signals having the closest phases to one another or phases that are separated by a maximum defined interval (e.g., one sixty-fourth of a period of the input signal).

In step S20, the management system 10 may adjust the input pulse width to a form an output pulse width consistent with the availability of the interpolated reference signal as one possible reference phase. The output pulse width may be formed with reference to a reference signal with a corresponding reference phase derived from the interpolation of step S18 or a non-interpolated reference signal. The interpolation of the reference signal provides a greater selection of reference phases than might otherwise be available. However, the actual selection of the reference phases in not necessarily limited to the extra reference phases provided by the interpolation.

The output pulse width may be defined by a first signal having a first reference phase for a leading edge of the pulse and a second signal having a second reference phase a for a trailing edge of the pulse. The duration between the leading edge and the trailing edge defines the output pulse width. In one example, the input pulse width is adjusted to the output pulse width based upon a recording control signal for controlling recording of a recorder. The recorder may comprise a recording device 32 that writes data, reads data, or both writes data and reads data to a magnetic storage medium, such as a hard-disk drive or a magnetic storage medium. The input pulse width may be equal to the output pulse width, or the output pulse width may exceed the input pulse width by up to one period, for instance. The output multiplexer 28 selects or the management system selects a reference signal with an appropriate reference phase for formation of the output pulse width consistent with the determined adjustment of step S20.

Figure 4:
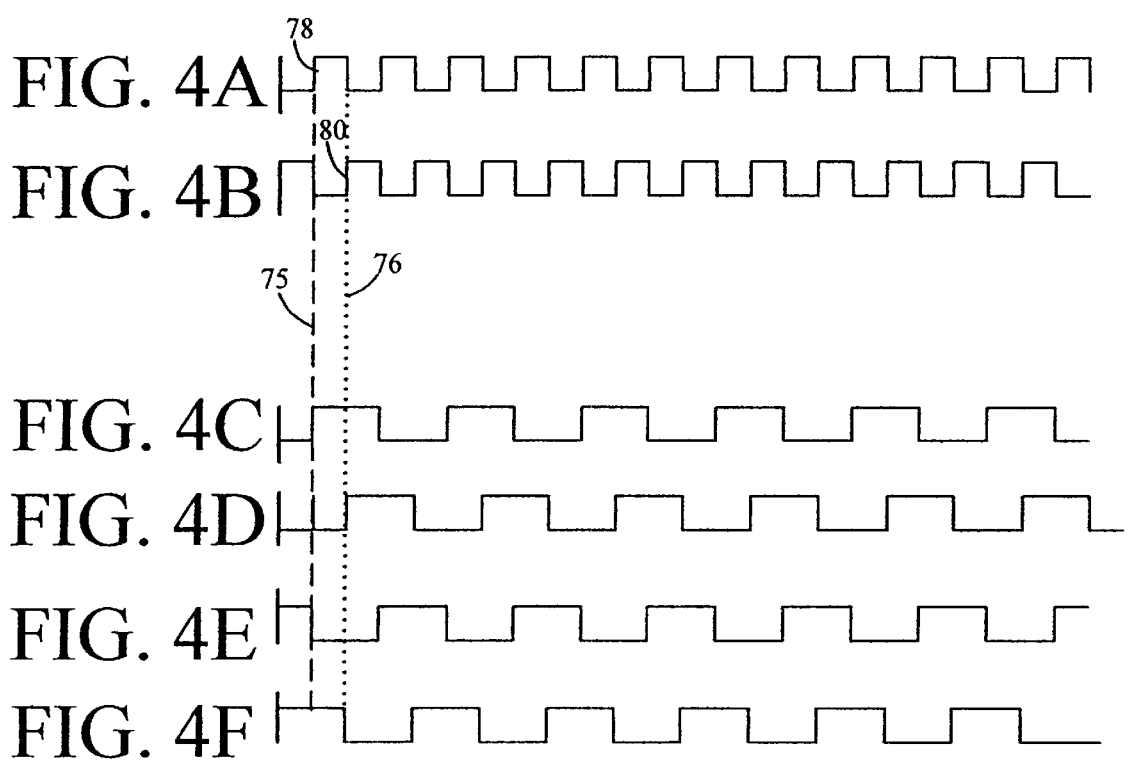
FIG. 4A is a first input signal that may be applied to at least one of frequency division and inverting in accordance with the invention.
FIG. 4B is a second input signal that is inverted in phase with respect to the first input signal of FIG. 4A.
FIG. 4C is an in-phase output signal that results from frequency division of the first input signal of FIG. 4A to increase the number of reference signals with associated distinct phases.
FIG. 4D is an in-phase output signal that results from frequency division of the second input signal of FIG. 4B to increase the number of reference signals associated with distinct phases.
FIG. 4E is an out-of-phase output signal that results from frequency division and inversion of the first input signal of FIG. 4A to increase the number of reference signals associated with distinct phases.
FIG. 4F is an out-of-phase output signal that results from frequency division and inversion of the second input signal of FIG. 4B.

In FIG. 4A through FIG. 4F, the signals are shown having amplitudes in the vertical axes and time is indicated by the common horizontal axis. FIG. 4A is a first input signal 78 that may be applied to at least one of frequency division and inverting in accordance with the invention. FIG. 4B is a second input signal 80 that is inverted in phase with respect to the first input signal 78 of FIG. 4A.

FIG. 4C is an in-phase output signal that results from frequency division of the first input signal 78 of FIG. 4A to increase the number of reference signals with associated distinct phases. The dashed lines 75 between FIG. 4A and FIG. 4C indicate the in-phase phase relationship between the first input signal 78 of FIG. 4A and the divided signal of FIG. 4C. Although the dashed line intercepts the rising edge of respective pulses of FIG. 4A of a lesser period and of FIG. 4C of a greater period, in an alternate embodiment the in-phase relationship could be defined by a falling edge of the respective pulses.

FIG. 4D is an in-phase output signal that results from frequency division of the second input signal 80 of FIG. 4B to increase the number of reference signals associated with distinct phases. The dotted lines 76 between FIG. 4B and FIG. 4D indicate the in-phase phase relationship between the second input signal 80 of FIG. 4B and the divided signal of FIG. 4D. Although the dotted line 76 intercepts the rising edge of respective pulses of FIG. 4B of a lesser period and of FIG. 4D of a greater period, in an alternate embodiment the in-phase relationship could be defined by a falling edge of the respective pulses.

FIG. 4E is an out-of-phase output signal that results from frequency division and inversion of the first input signal 78 of FIG. 4A to increase the number of reference signals associated with distinct phases. The dashed lines 75 between FIG. 4A and FIG. 4E indicate the out-of-phase or inverted phase relationship between the first input signal of FIG. 4A and the divided signal of FIG. 4E.

FIG. 4F is an out-of-phase output signal that results from frequency division and inversion of the second input signal 80 of FIG. 4B. The dotted lines 76 between FIG. 4B and FIG. 4F indicate the out-of-phase or inverted phase relationship between the first input signal of FIG. 4B and the divided signal of FIG. 4F.

FIG. 4A through FIG. 4F collectively illustrate input signal (e.g., 78, 80) and output signals (FIG. 4C through FIG. 4F) associated with the primary divider 18 or the secondary divider 22 of FIG. 1.

The divider (e.g., primary divider 18 or the second divider 22) divides the signal by two or another integer, in accordance with two alternate techniques. Under a first technique, an output of the divider has an output waveform (e.g., square wave) of FIG. 4C of double the period of an input waveform of FIG. 4A and the input waveform is in phase with the output square wave.

Under a second technique, an output of the divider has an output waveform of FIG. 4E of double the period of the input waveform of FIG. 4A and the input waveform is one hundred and eighty degrees out of phase or inverted with respect to the output waveform. A control input may allow the selection of the in-phase signal in accordance with the first technique or the selection of an out-of-phase (e.g., one-hundred and eighty degrees) signal in accordance with a second technique. Accordingly, at the first divider output at least two-times the number of input phases are available. As shown in FIG. 4B, the same derivation procedure may be applied to an in-phase parent of FIG. 4A and an inverted parent of FIG. 4B as signal inputs to a divider to yield a total of four distinct phase variations of child waveforms for formation of a desired pulse width, as shown in FIG. 4C through FIG. 4F.

Figure 5:
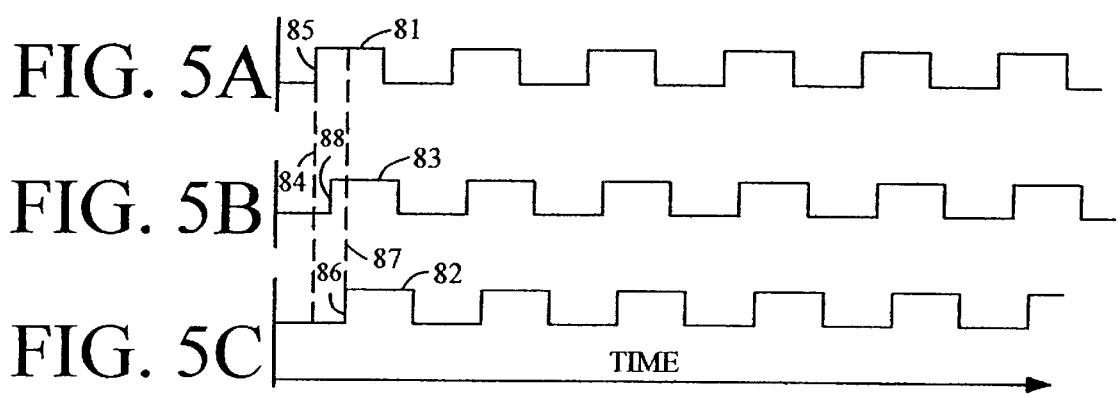
FIG. 5A represents one input reference signal for application to an interpolator or interpolation process in accordance with the invention.
FIG. 5B represents an interpolated reference signal resulting from the an input of the input reference signals of FIG. 5A and FIG. 5C.
FIG. 5C represents an input reference signal for application to an interpolator or interpolation process in accordance with the invention.

FIG. 5A, FIG. 5B and FIG. 5C illustrate the operation of the interpolator 20 in graphical terms. The amplitudes of the waveforms of FIG. 5A through FIG. 5C are illustrated by the vertical axes, whereas time is illustrated by the common horizontal axis. The waveform of FIG. 5A represents one input reference signal 81 for application to the interpolator 20 and the waveform of FIG. 5C represents another input reference signal 82 for application to the interpolator 20. FIG. 5B represents an interpolated reference signal 83 (e.g., a reference clock signal) resulting from the an input of the input reference signals of FIG. 5A and FIG. 5C. If two input signals having two different phases of FIG. 5A and FIG. 5C are inputted into the interpolator 20, the interpolator 20 may determine the average of the two different phases or another intermediate interpolation point between the two adjacent phases such that the interpolated signal of FIG. 5B has an interpolated phase between a first input signal phase and a second input signal phase. As shown in FIG. 5A, the first input signal phase is indicated by the dashed line 84 and coincides with leading edge 85. The second input signal phase is indicated by the dashed line 87 which coincides with leading edge 86. An intermediate leading edge 88 of the interpolated reference signal 83 is temporally intermediate to the leading edges (85 and 86).

FIG. 6A through FIG. 6E illustrate signals inputted into the secondary multiplexers 24 of the system for managing a pulse width. The amplitudes of the waveforms of FIG. 6A through FIG. 6E are illustrated by the vertical axes, whereas the time is illustrated by the common horizontal axis.

Figure 6:
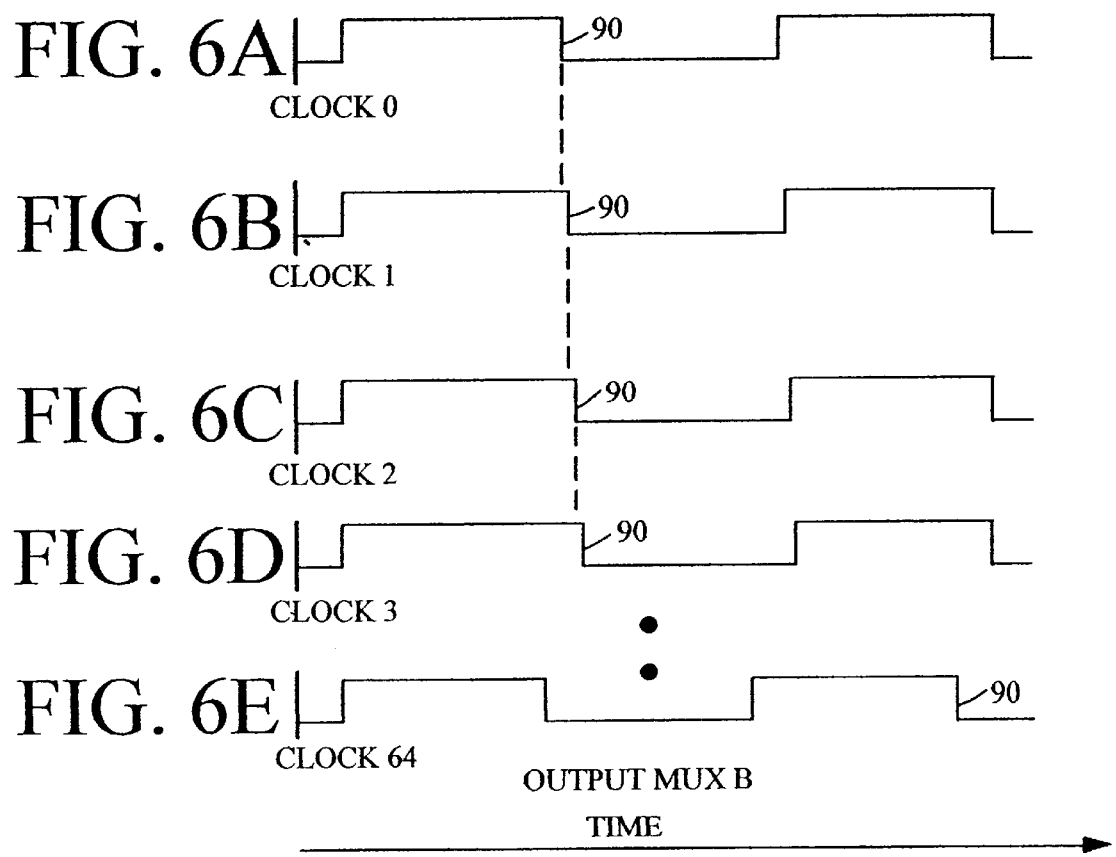
FIG. 6A through FIG. 6E show illustrative input signals of a secondary multiplexer in accordance with the invention.

In FIG. 6A, a signal designated clock 0 is in phase with a clock signal or in phase with a first phase of a reference signal provided by oscillator 12. In FIG. 6B, a signal designated clock 1 is delayed by a delay interval from the clock 0 signal. The delay interval is based on the available number of phases (e.g., 4N, where N is the maximum number of oscillator phases of oscillator 12) that fall within a single period of an outputted signal. In the example of FIG. 6A through FIG. 6E, N equals sixteen and sixty-four phases fall within a single period, although in alternate embodiments a different number of phases may fall within a period of the signal. The adjacent available phases may be separated from one another by fixed temporal increments, or step sizes, as illustrated by the stair-case relationship of adjacent railing edges 90 in the waveform of FIG. 6A through FIG. 6E. The signals of FIG. 6A through FIG. 6E offer various pulses that are offset in phase from one another to provide an adjustment to the triggering of the synchronizers 26.

Figure 7:
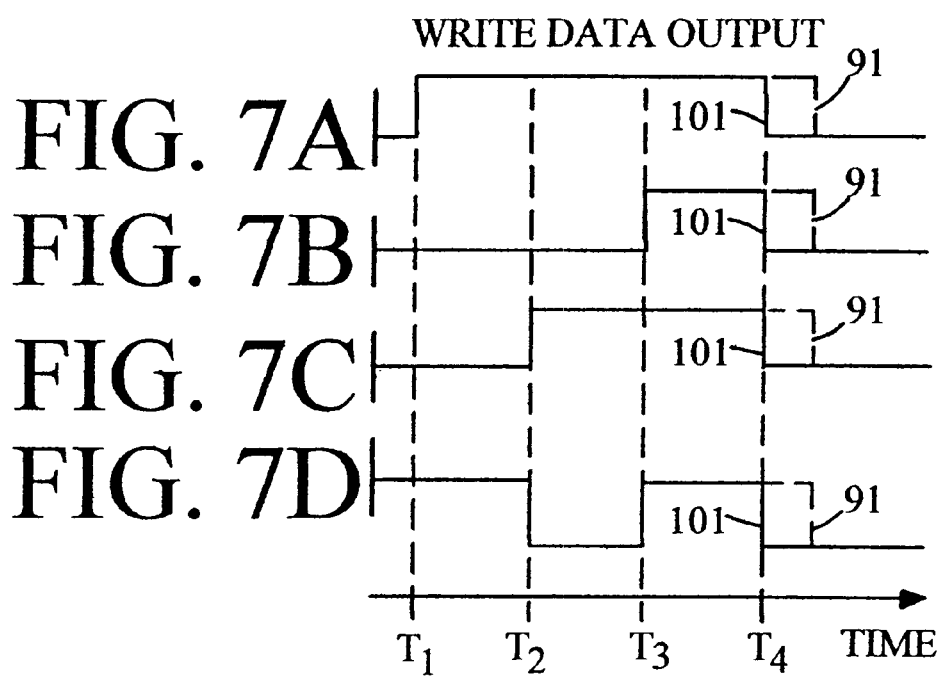
FIG. 7A through FIG. 7D show illustrative input signals of an output multiplexer in accordance with the invention.

FIG. 7A through FIG. 7D provide an illustrative write data output signals as viewed at an input of the output multiplexer 28. The amplitudes of the waveforms of FIG. 7A through FIG. 7D are illustrated by the vertical axes, whereas the time is illustrated by the common horizontal axis. Clock transition times are shown at $T_1$, $T_2$, $T_3$, and $T_4$ along the common horizontal axis. The clock transitions times may coincide with any transitions in the output signals of FIG. 7A through FIG. 7D. FIG. 7A represents a write output signal having a first pulse configuration. FIG. 7B represents a write output signal having a second pulse configuration. FIG. 7C represents a write output signal having a third pulse configuration. FIG. 7D represents a write output signal having a fourth pulse configuration.

Any of the pulse configurations of FIG. 7A through FIG. 7D may be formed by the pulse management and formation techniques disclosed herein. Further, pulse width or the output pulse width of the pulse width of any of the pulse configurations may be adjusted by changing the position of the falling edge through the selection of appropriate reference phases. The dashed lines 91 following the solid falling edge 101 of FIG. 7A through FIG. 7D represent potential adjustments in pulse width that may be used to enhance recording on a recording medium. Although only one dashed line 91 is shown per waveform, in practice a plurality of possible adjustments (e.g., 64 possible temporal positions of the trailing edge of the pulse) to the pulse width is possible at discrete intervals dependent upon the reference phases.

The write data output may be selected based on a controller output 30 that selects one of the write data output signals of FIG. 7A through FIG. 7D, along with any desired pulse width adjustment from an input pulse width of an input signal to an output pulse width of an output signal, to enhance or optimize writing on a magnetic storage medium, reading from a magnetic storage medium, or both writing or reading. In one example, the magnetic storage medium comprise a hard-disk or another magnetic disk.

Figure 8:
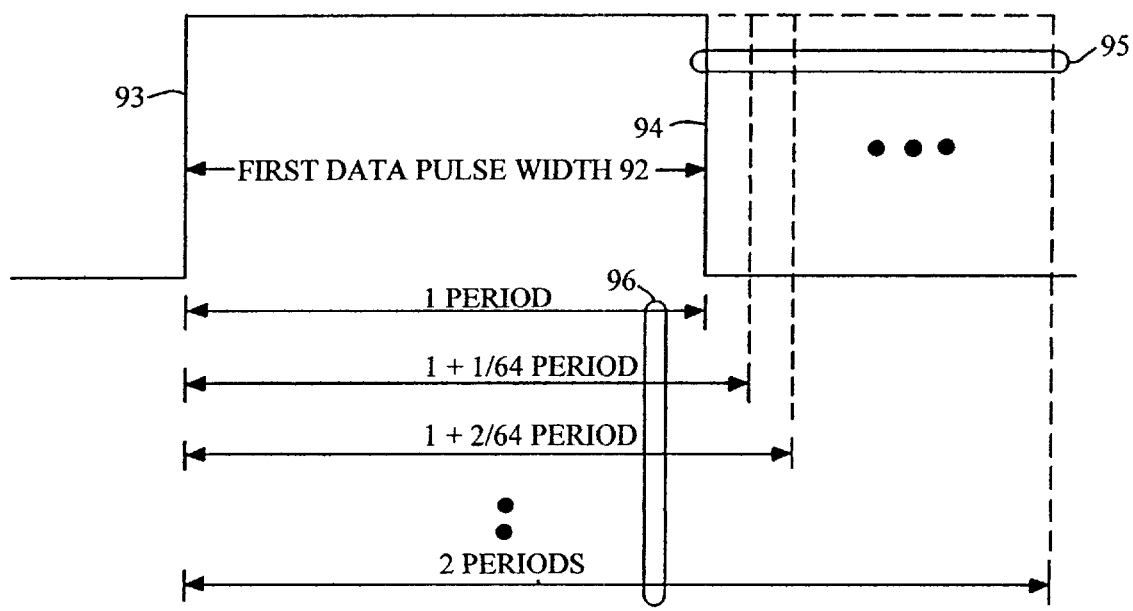
FIG. 8 is a diagram of a data pulse of a signal in accordance with the invention.

FIG. 8 provides an illustrative diagram of a signal pulse having a data pulse width. The data pulse width is defined as an interval between a leading edge 93 and a falling edge (e.g., 94 or 95). As used herein, a leading edge is synonymous with a rising edge and a trailing edge is synonymous with a falling edge. The first pulse has an input pulse width 92 that is defined by a duration of one period and falls between leading edge 93 and trailing edge 94. The input pulse width 92 of an input signal is changed to an output pulse width 96 of the output signal. The pulse width interval may be changed by altering the trailing edge or falling edge. The falling edge 95 may be selected from a group of 4N reference phases (e.g., sixty-four temporal increments) within a period. Accordingly, the output pulse width 96 may be varied within a range from a first period duration to a second period duration.

In an alternate embodiment, the oscillator 12 may run at double a base frequency or another higher frequency to support further frequency division of the signal by a factor of two. The doubling of the base frequency may be used to double the number of reference phases available for the pulse-width manager 10 (e.g., write pre-compensation module). However, it may be more cost effective to use interpolation, inversion in conjunction with division, or both, as opposed to additional stages of frequency division in conjunction with higher base frequencies of the oscillator 12 to increase the number of available oscillator phases. The oscillator frequency of the oscillator 12 may remain the same, while still maximizing or increasing the number of available reference phases of the reference signals by one or more of the following techniques: delaying the reference signal, interpolating reference signals (e.g., neighboring reference signals), inverting a reference signal, and dividing the reference signal. The number of delay stages of the oscillator 12 may be limited to a maximum for the provision of N discrete phases, whereas the management system 10 may provide at least 4N discrete reference phases for adjustment of the pulse width in a precise and reliable manner. The management system 10 supports the provision of 4N discrete references phases with reliable temporal spacing between adjacent phases consistent with reducing the impact of disparities in manufacturing processes or otherwise.

The foregoing description of the method and system describes several illustrative examples of the invention. Modifications, alternative arrangements, and variations of these illustrative examples are possible and may fall within the scope of the invention. Accordingly, the following claims should be accorded the reasonably broadest interpretation which is consistent with the specification disclosed herein and not unduly limited by aspects of the preferred embodiments disclosed herein.

We claim:

1. A system for managing a pulse of a signal, the system comprising:
   an oscillator for generating reference signals associated with a first set of phases;
   a plurality of multiplexers for selecting selected reference signals among the generated reference signals, the selected reference signals having selected reference phases of the first set of phases;
   a plurality of primary dividers adapted to divide the selected reference signals to increase the period of the selected reference signals; and
   an interpolator interpolating between neighboring reference phases of the divided signals to increase the number of reference phases available for formation of an output pulse width of an output signal based on the input of an input pulse width of an input signal.

2. The system according to claim 1 further comprising an external reference frequency source for feeding the oscillator; the reference signals and divided signals, derived from the reference signals, being locked in phase with respect to the external reference frequency source.

3. The system according to claim 1 further comprising an external reference frequency source for feeding the oscillator; the reference signals being locked in phase with respect to the external reference frequency source and wherein interpolated reference phases, outputted by the interpolator, are not locked in phase with respect to the external reference frequency source.

4. The system according to claim 1 wherein the dividers are associated with corresponding inverters, each primary divider providing at least one of a standard reference phase and each inverter outputting an inverted version of the standard reference phase as distinct phases.

5. The system according to claim 1 wherein secondary dividers are arranged in tandem with the primary dividers, the secondary dividers increasing the previously increased period of the selected reference signals.

6. The system according to claim 1 wherein secondary dividers are cascaded with the primary dividers, the secondary dividers increasing the number of phases available for formation of the output pulse width by providing a secondary phase and a second inverted version of the secondary phase as distinct phases.

7. The system according to claim 5 wherein a secondary multiplexer is coupled to the interpolator and the secondary divider, the secondary multiplexer arranged to select at least one of an interpolator output phase and a secondary divider output phase.

8. The system according to claim 1 wherein a synchronizer has a clock input and an input terminal, the clock input accepting a reference output signal from an output multiplexer that receives signals from the interpolator having a corresponding reference phase and the input terminal accepting an input pulse having an input pulse width, the synchronizer synchronizing an edge of the input pulse to a clock edge of the reference output signal.

9. The system according to claim 1 further comprising:
   a plurality of synchronizers for synchronizing a first pulse of an input signal to the reference signals;
   an output multiplexer coupled to the synchronizers to form
   the output pulse width based on a selection of at least a starting reference signal that coincides with a rising edge of the first pulse of the input signal having the input pulse width.

10. The system according to claim 1 further comprising:
    a plurality of synchronizers for synchronizing a first pulse of an input signal to the reference signals;
    an output multiplexer coupled to the synchronizers to form the output pulse width based on a selection of at least an ending reference phase that is referenced to a falling edge of a first pulse of the signal having the input pulse, wherein the output pulse width is defined by the duration between the rising edge and the falling edge.

11. The system according to claim 10 wherein the ending reference phase is offset from the falling edge of the first pulse to provide an adjustment interval as a difference between the input pulse width and the output pulse width.

12. The system according to claim 1 further comprising a controller for controlling the output pulse width of an output signal based on a selection by the controller of one of at least sixty-four phases corresponding to a trailing edge of the output pulse width.

13. A method for managing a pulse of a signal, the method comprising:
    receiving an input signal having a period and an input pulse width;
    generating reference signals associated with corresponding distinct reference phases;
    interpolating neighboring reference signals among the generated reference signals to derive an interpolated phase; and
    adjusting the input pulse width by forming an output pulse width from a triggering edge of a first selected signal of a first selected phase and a triggering edge of a second selected signal of a second selected phase.

14. A method for managing a pulse of a signal, the method comprising:
    receiving an input signal having a period and an input pulse width;
    generating reference signals associated with corresponding distinct reference phases;
    interpolating neighboring reference signals among the generated reference signals to derive an interpolated phase; and forming an output pulse width from a triggering edge of a first selected signal of a first selected phase and a triggering edge of a second selected signal of a second selected phase, wherein the generating comprises feeding an oscillator with an external reference frequency source; the reference signals being locked in phase with respect to the external reference frequency source.

15. A method for managing a pulse of a signal, the method comprising:

receiving an input signal having a period and an input pulse width;

generating reference signals associated with corresponding distinct reference phases;

interpolating neighboring reference signals among the generated reference signals to derive an interpolated phase;

forming an output pulse width from a triggering edge of a first selected signal of a first selected phase and a triggering edge of a second selected signal of a second selected phase; and adjusting the input pulse width to the output pulse width based upon a recording control signal for controlling recording on a magnetic storage medium.

16. A method for managing a pulse of a signal, the method comprising:

receiving an input signal having a period and an input pulse width;

generating reference signals associated with corresponding distinct reference phases;

interpolating neighboring reference signals among the generated reference signals to derive an interpolated phase;

forming an output pulse width from a triggering edge of a first selected signal of a first selected phase and a triggering edge of a second selected signal of a second selected phase; and synchronizing the reference phases to the received pulse having the input pulse width to generate a second pulse having an output pulse width.

17. A method for managing a pulse of a signal, the method comprising:

receiving an input signal having a period and an input pulse width;

generating reference signals associated with corresponding distinct reference phases;

interpolating neighboring reference signals among the generated reference signals to derive an interpolated phase; and forming an output pulse width from a triggering edge of a first selected signal of a first selected phase and a triggering edge of a second selected signal of a second selected phase, wherein the generating comprises generating a first set of phases as the corresponding distinct phases, neighboring ones of the first set separated from each other by a uniform interval.

18. A method for managing a pulse of a signal, the method comprising:

receiving an input signal having a period and an input pulse width;

generating reference signals associated with corresponding distinct reference phases;

interpolating neighboring reference signals among the generated reference signals to derive an interpolated phase;

forming an output pulse width from a triggering edge of a first selected signal of a first selected phase and a triggering edge of a second selected signal of a second selected phase; and determining which of the reference phases coincides with a rising edge of a pulse having an input pulse width.

19. A method for managing a pulse of a signal, the method comprising:

receiving an input signal having a period and an input pulse width;

generating reference signals having distinct corresponding reference phases;

dividing and inverting the reference signals to increase the number distinct phases derived from the generated reference signals; and adjusting an input pulse width to form the output pulse width based on the inverting.

20. The method according to claim 19 wherein the generating comprises feeding an oscillator with an external reference frequency source; the reference signals being locked in phase with respect to the external reference frequency source.

21. The method according to claim 19 wherein the adjusting comprises:

adjusting the input pulse width to the output pulse width based upon a recording control signal for controlling recording on a magnetic storage medium.

22. A method for managing a pulse width of a signal, the method comprising:

receiving an input signal having a period and an input pulse width;

generating reference signals having distinct corresponding reference phases, wherein the generating comprises feeding an oscillator with an external reference frequency source; the reference signals being locked in phase with respect to the external reference frequency source;

interpolating between the generated reference signals having distinct phases derived from the reference phases of the signal; and adjusting the input pulse width to form an output pulse width based on the interpolation.

23. A method for managing a pulse width of a signal, the method comprising:

receiving an input signal having a period and an input pulse width;

generating reference signals having distinct corresponding reference phases;

interpolating between the generated reference signals having distinct phases derived from the reference phases of the signal; and adjusting the input pulse width to form an output pulse width based on the interpolation, wherein the adjusting comprises adjusting the input pulse width to the output pulse width based upon a recording control signal for controlling recording on a magnetic storage medium.

* * * * *